United States Patent
Phan et al.

(10) Patent No.: US 8,988,139 B2
(45) Date of Patent: Mar. 24, 2015

(54) SELF-SELECTED VARIABLE POWER INTEGRATED CIRCUIT

(71) Applicant: International Business Machines Corporation, Armonk, NY (US)

(72) Inventors: Nghia V. Phan, Rochester, MN (US); Jonathan H. Raymond, Richmond, VT (US); Peter A. Sandon, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/903,350

(22) Filed: May 28, 2013

(65) Prior Publication Data

US 2014/0354333 A1    Dec. 4, 2014

(51) Int. Cl.
*G05F 1/10* (2006.01)
*H03K 3/012* (2006.01)

(52) U.S. Cl.
CPC ................................ *H03K 3/012* (2013.01)
USPC .......................................... 327/540; 713/320

(58) Field of Classification Search
CPC ............................................... G06F 1/324
See application file for complete search history.

(56) References Cited

U.S. PATENT DOCUMENTS

| | | | |
|---|---|---|---|
| 6,748,545 B1 * | 6/2004 | Helms ........................... | 713/300 |
| 7,317,605 B2 * | 1/2008 | Donze et al. .................. | 361/103 |
| 7,366,929 B1 * | 4/2008 | Mimberg ....................... | 713/310 |
| 7,523,373 B2 * | 4/2009 | Russell et al. ................ | 714/745 |
| 7,532,003 B1 * | 5/2009 | Greenhill et al. ......... | 324/764.01 |
| 7,915,910 B2 * | 3/2011 | von Kaenel ..................... | 326/16 |
| 7,928,747 B2 * | 4/2011 | Dobberpuhl et al. ...... | 324/750.3 |
| 7,930,574 B2 * | 4/2011 | Cai et al. ....................... | 713/322 |
| 8,601,292 B2 * | 12/2013 | Lam et al. ..................... | 713/310 |
| 8,615,687 B2 * | 12/2013 | Sandhu et al. ................ | 714/708 |
| 2007/0290704 A1 * | 12/2007 | Shyh et al. .................... | 324/763 |
| 2011/0109378 A1 * | 5/2011 | Buechner et al. ............. | 327/540 |
| 2012/0218034 A1 * | 8/2012 | Turullols et al. ............. | 327/540 |

* cited by examiner

*Primary Examiner* — Thomas J Hiltunen
(74) *Attorney, Agent, or Firm* — David Cain; Roberts Mlotkowski Safran & Cole, P.C.

(57) ABSTRACT

A self-selected variable power integrated circuit (IC) which maximizes manufacturing yield and reduces system design cost and related methods are disclosed. The method includes determining characteristics of an integrated circuit (IC). The method includes determining a module specific voltage of the IC to meet a designed target frequency and power characteristics, based on the determined IC characteristics. The method includes setting the module specific voltage by using a combination of fuses within the IC.

19 Claims, 6 Drawing Sheets

SELF-SELECTED VARIABLE POWER INTEGRATED CIRCUIT

FIELD OF THE INVENTION

The invention relates to integrated circuits and, more particularly, to a self-selected variable power integrated circuit (IC) which maximizes manufacturing yield and reduces system design cost.

BACKGROUND

Processors need to meet performance and power specifications. For example, processors typically require a single voltage to meet operation performance specifications. To accomplish this objective and optimize processing yield, it is a common practice to require a single voltage range for all integrated circuits (ICs) of a particular design. However, by requiring a single voltage, the manufacturing yield is reduced due to process variations. For example, manufacturing yield may be reduced because manufacturing processes will yield faster, higher power parts, as well as slower, lower power parts. As such, for example, faster, higher power parts will exceed the current limits or thermal designs of the system unless an unreasonably large thermal and/or power range is designed into the system.

To compensate for these process variations, some designs include multiple voltages for an IC with the IC providing the voltage requirements on output pins. In this scenario, the manufacturer will assign different part numbers for each group. This complicates the system manufacturing process. Another design approach is to use external pull-ups on the voltage selection pins to insure a valid voltage until the correct value can be output. This design approach is also problematic. For example, it requires specific power supply sequencing to prevent invalid transient power values as the IC powers up, adding complexity and cost to the system design.

Accordingly, there exists a need in the art to overcome the deficiencies and limitations described hereinabove.

SUMMARY

In an aspect of the invention, a method comprises determining characteristics of an integrated circuit (IC). The method further comprises determining a module specific voltage of the IC to meet a designed target frequency and power characteristics, based on the determined IC characteristics. The method further comprises setting the module specific voltage by using a combination of fuses within the IC.

In an aspect of the invention, a method comprises driving a voltage that guarantees the integrated circuit (IC) will work within system power/thermal design parameters of a system, during power up time. The method further comprises reading an IC specific operating voltage from set fuses of the IC. The method further comprises adjusting the IC to the IC specific operating voltage by driving output pins with fused voltage values, which allows the IC to stay within power/thermal budget for all design functions.

In an additional aspect of the invention, a method comprises determining a combination of fuses that need to be set in order to provide a module specific voltage for an integrated circuit (IC) under test. The method further comprises setting the combination of fuses to provide the module specific voltage in order for the IC under test to run within predetermined performance parameters including frequency and power consumption within a system environment.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structures of the present invention. In still further embodiments, a method in a computer-aided design system is provided for generating a functional design model of the structures of the present invention. The method comprises generating a functional representation of the structural elements of the structures of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to a self-selected variable power integrated circuit (IC) which maximizes manufacturing yield and reduces system design cost. In more specific embodiments, the present invention provides systems and processes for optimizing process yield while minimizing required system power/cooling requirements with minimal system components with variable supply sorting. For example, in implementation, the systems and processes of the present invention customize the voltage for each module, e.g., integrated circuit (IC) (also referred to as a chip), in order to ensure that each chip (IC) will meet performance and power specifications within a system. More specifically, in embodiments, the systems and processes of the present invention customize the voltage for each IC by using programmable fuses. Advantageously, by implementing the systems and processes of the present invention, minimum system components are required and all ICs across all voltage ranges can have one part number. The present invention can also be used to design a narrower power and thermal window, reducing system cost and still maximize the manufacturing yield for the IC, thereby reducing IC manufacturing cost.

In specific embodiments, during manufacture, a minimum required operating voltage is initially determined for the IC. This voltage, as well as a "power on reset" voltage, is programmed into the IC. At system power-up, the power on reset voltage is output on voltage selection pins (Voltage Identification Digital (VID) pins) to a voltage regulator selecting a voltage that guarantees all ICs will work within the system frequency and power/thermal design parameters during power up time. Also, at system power up, the system drives the IC power to this predetermined power on reset voltage. A second operating voltage, which is IC specific, is then read by the IC and output on the voltage selection pins. This second voltage is optimized to allow the specific IC to meet the frequency requirements and stay within the power/thermal budget for all design functions. In this way, it is possible to use minimum system components, and all ICs across all voltage ranges can have one part number. The system and processes of the present invention can also be used to design a narrow power and thermal window, reducing system cost and still maximizing the manufacturing yield for the IC, thereby reducing IC manufacturing cost.

In more specific embodiments, at system power up, an external power voltage regulator module (VRM) is forced to supply a predetermined nominal voltage in which every IC is guaranteed to operate. At this time, the IC is operating at a slow power up frequency and has reduced power and thermal characteristics across all manufacturing process corners. At the end of reset time, the IC is driving the same voltage selection on its output pins and the system allows the VRM to be controlled by the IC voltage selection pins. The IC then reads its module specific required voltage and drives this value out on the power selection pins. For fast process corner ICs, for example, this will be a lower voltage, reducing IC leakage current and thereby limiting the power consumed by the IC, and keeping the IC under the thermal design limit while meeting the frequency target. For slower process corner ICs, for example, this will be a higher voltage to meet the frequency target but the IC will have less leakage current and the overall power consumed will be similar to the fast process corner ICs. In embodiments, a settling time is allowed for the VRM to reach the new voltage value before the IC is allowed to proceed to its full function state.

Figure 1:
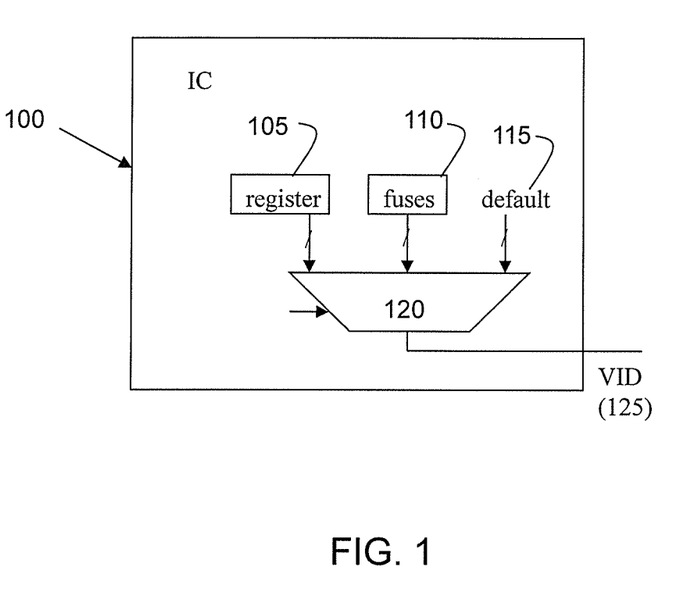
FIG. 1 shows a schematic of an exemplary integrated circuit (IC) in accordance with aspects of the present invention.

FIG. 1 shows a schematic of an exemplary integrated circuit (IC) in accordance with aspects of the present invention. More specifically, this schematic shows, for example, an IC 100 comprising a register 105, e-fuses 110 and default input 115. In embodiments, during manufacture, the e-fuses can be set to drive VID pins 125 at a certain voltage in order to achieve a certain designed frequency and power characteristics. These fuses 110 can be read and the fuse value can be selected by, for example, using an internal multiplexor 120 so the VID output drives at a module specific voltage Vdd, for a designed frequency and power characteristic, within a system.

By using the exemplary IC 100 of FIG. 1, it is possible to program the IC with any combination of fuses 110 to provide for module specific voltage for the specific IC 100. By way of an illustrative, non-limiting example, the IC 100 can be set with six fuses blown in a specified pattern, e.g., 110100 (blow, blow, no blow, blow, no blow, no blow) and that pattern might correspond to a VRM output of, for example, 1.05 v. For a different IC 100, those same six fuses might be blown with a different pattern, e.g., 101101, corresponding to a VRM output of, for example, 0.975 v. These fuses are blown or set at manufacturing test time, and then are fixed thereafter.

Figure 2:
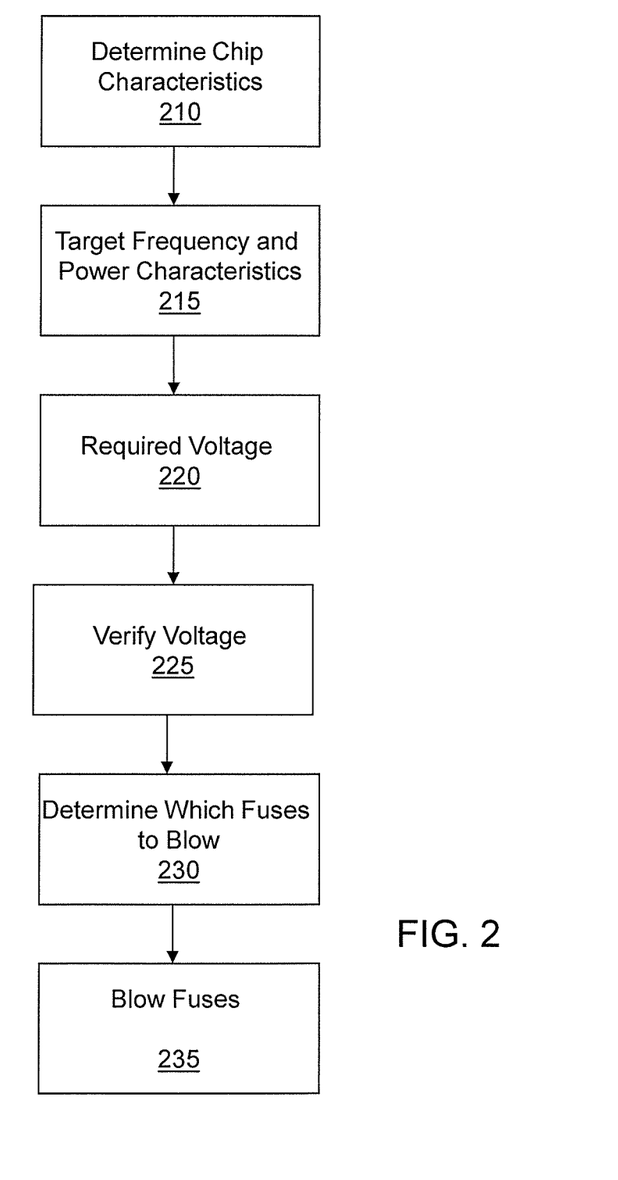
FIG. 2 is a flowchart of manufacturing processes in accordance with aspects of the present invention.

FIG. 2 is a flowchart of manufacturing processes in accordance with aspects of the present invention. The steps of FIG. 2 may be implemented on a computing infrastructure such as, for example, shown in FIG. 5. The flowchart illustrates the architecture, functionality, and operation of possible implementations of systems, methods and computer program products according to various embodiments of the present invention as described herein.

At step 210, during manufacturing processes, the system and processes of the present invention determine the characteristics of a chip. For example, the system and processes determine whether the chip is a fast chip or a slow chip. In embodiments, such determination may be provided during testing of the IC (chip), as should be understood by those of ordinary skill in the art. More specifically, in embodiments, the chip is characterized on a manufacturing tester by measuring the current that the chip draws and the speed of a test oscillator, e.g., PSRO (performance screen ring oscillator) on the chip when running at some fixed voltage.

At step 215, target frequency and power characteristics are provided for the IC (chip). For example, the target frequency and power characteristics are provided by IC (chip) specifications, e.g., design specifications for the IC. In embodiments, such target frequency and power characteristics can be provided by the designer, manufacturer and/or through look-up tables, as illustrative examples.

At step 220, the voltage to run the specific chip at the designed target frequency and power characteristics is selected for the given chip using the given information provided in steps 210 and 215, for example. This can be determined through a look-up table which shows what voltage is needed for certain frequencies and power characteristics based on the specific chip characteristics. For example, for a fast chip, a lower voltage may be required, compared to a slow chip where a higher voltage may be required in order to achieve the target frequency and power characteristics. The tester can verify that the chosen voltage is correct by running additional tests at that chosen voltage, at step 225, prior to blowing the corresponding VID value into the fuses.

At step 230, a determination is made as to which fuses should be blown in order to provide the required IC specific voltage. Again, this determination can be made through a look-up table, where values are provided for each of the fuses and combinations thereof. At step 235, the appropriate fuses are blown in order to provide a module specific voltage which would allow the IC to run at a target frequency and power characteristics.

Figure 3:
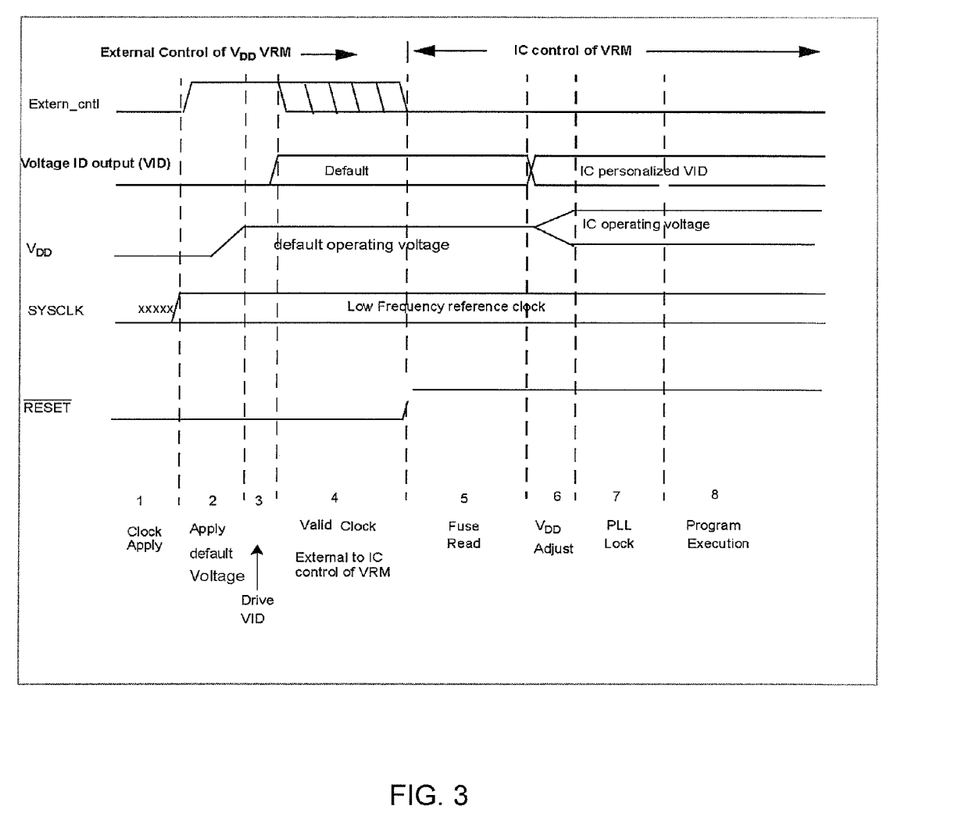
FIG. 3 is an exemplary waveform which shows implementation of processes in accordance with aspects of the present invention.

FIG. 3 is an exemplary waveform which shows implementation of processes in accordance with aspects of the present invention. More specifically, FIG. 3 shows a sequence of processes for powering up an IC (chip) of the present invention, in a system environment. For example, FIG. 3 may be representative of a processor being powered up in a computing environment. In implementation, the waveform includes eight (8) stages, as described herein. The stages of the waveform are provided for a circuit (IC) as it is powered on to its nominal operating voltage and frequency.

1. Apply Initial Clock Frequency

Initially, the system and processes of the present invention set a clock frequency, e.g., a low clock frequency, in which all ICs will operate. In embodiments, the frequency can be, for example, 25 MHz, e.g., low frequency; although, this frequency can change depending on a particular IC design, i.e., performance specifications. The clock frequency will assert RESET and drive SYSCLK at the low frequency, e.g., 25 MHz.

2. Apply a Voltage by External Source

At this stage, a default voltage will be applied (driven) from an external control. The default voltage is output from the VRM (voltage regulator module) in order to begin control of the IC. As shown, Vdd is the default voltage at this stage. The IC will be operating at a slow power up frequency at this time and will have reduced power and thermal characteristics across all manufacturing process corners.

The default voltage is output by the VRM, which selects a voltage that guarantees all ICs will work within the system power/thermal design parameters during power up. In embodiments, the default voltage is 1V; although, this voltage can change depending on a particular IC design, i.e., performance specifications. VID pins are not driven during this time, and it is possible to specify a random value of the voltage.

3. Drive Voltage ID (VID)

At this stage, the IC module drives the voltage selection at its output pins (VID output pins), e.g., the IC drives the voltage selection on its output pins to the VRM. The external control is still applied at this time. In embodiments, the output pins (e.g., voltage selection pins or VID pins) specify the same default voltage (VID voltage) as Vdd during start up, to ensure that all parts operate regardless of manufacturing variability; that is, VID voltage is selected such that all ICs are guaranteed to work within the system power/thermal design parameters. As with external control, the default voltage specified by the VID pins can be dependent on system design and technology.

In specific embodiments, the default voltage will be high enough to support the required frequency, as noted above. In embodiments, the VID voltage is applied at the third cycle of the SYSCLK, and output to the VRM.

4. Valid Clock

At this stage, the system increases the clock frequency to its nominal operating frequency, e.g., 200 MHz, driving the SYSCLK. When there is a valid clock, the system and processes proceed with the power on sequence of the present invention. The external control of the VRM should be discontinued sometime during this stage so that the voltage specified by the IC VID pins now controls the VRM. The power on reset (POR) finite state machine (FSM) determines the start of the voltage stabilization period for the VRM Vdd voltage specified by the VID pins.

5. Read e-Fuses

At this stage, the system and processes read the e-fuses (e.g., blown VID fuses) to determine the appropriate voltage adjustment for driving the IC under certain power and specification conditions. For example, the system and processes of the present invention will read the e-fuses (VID fuses), e.g., six fuses to drive six VID pins with 64 different combinations, in order to determine the appropriate voltage for the IC, for the specified frequency (and/or other performance parameters). This can be accomplished by reading each fuse, e.g., voltage settings of the fuses, such that, for example, an internal multiplexor can now select the fuse value instead of the default value previously used.

In more specific embodiments, the system and processes of the present invention determine a module (e.g., IC) specific voltage. Illustratively, the system and processes of the present invention determine the required voltage needed to support a certain frequency and power in order to run the module (e.g., IC) within its system parameters, i.e., the system and processes of the present invention will read the VID fuses to determine the required voltage for the specific module. In embodiments, the module specific voltage should be determined in order to ramp up the phase lock loop (PLL) of the specific module.

6. Adjust Vdd

Once the VID fuses have been read in order to determine the module specific voltage, the corresponding VID fuse values will be used to drive the VID pins. In this way, the VID voltage is determined by the fused value, for the appropriate frequency and power requirements of the specific module. The IC can then read its module specific required voltage and drive this value out on the power selection pins.

In the example of FIG. 3, for example, the system and processes of the present invention might have determined that the specific part is a fast part with high power and hence adjusting the voltage to a lower voltage Vdd to run the IC within its required performance parameters, as shown in the decreasing value of Vdd during this period. However, in other implementations, the present invention can determine that the specific part is a slow part with low power and hence adjust the voltage Vdd to a higher voltage to run the IC within its required performance parameters, as shown in the alternative, increasing value of Vdd during this period. In this way, it is possible to provide a module specific voltage to operate at the full frequency with consistent power characteristics.

The external control of the VRM is discontinued prior to this stage, preferably prior to reading of the fuses. In this way, the POR FSM can determine the start of the voltage stabilization period for the VRM Vdd voltage specified by the VID pins. Also, at this stage, the POR FSM waits for the new Vdd value to stabilize, prior to advancing to subsequent stages.

7. PLL Lock

Once Vdd is stable, the PLL lock sequence is initiated at this stage.

8. Program Execution

At this stage, with the PLL locked, the POR FSM completes its sequence and enables the IC to work at full function.

Figure 4:
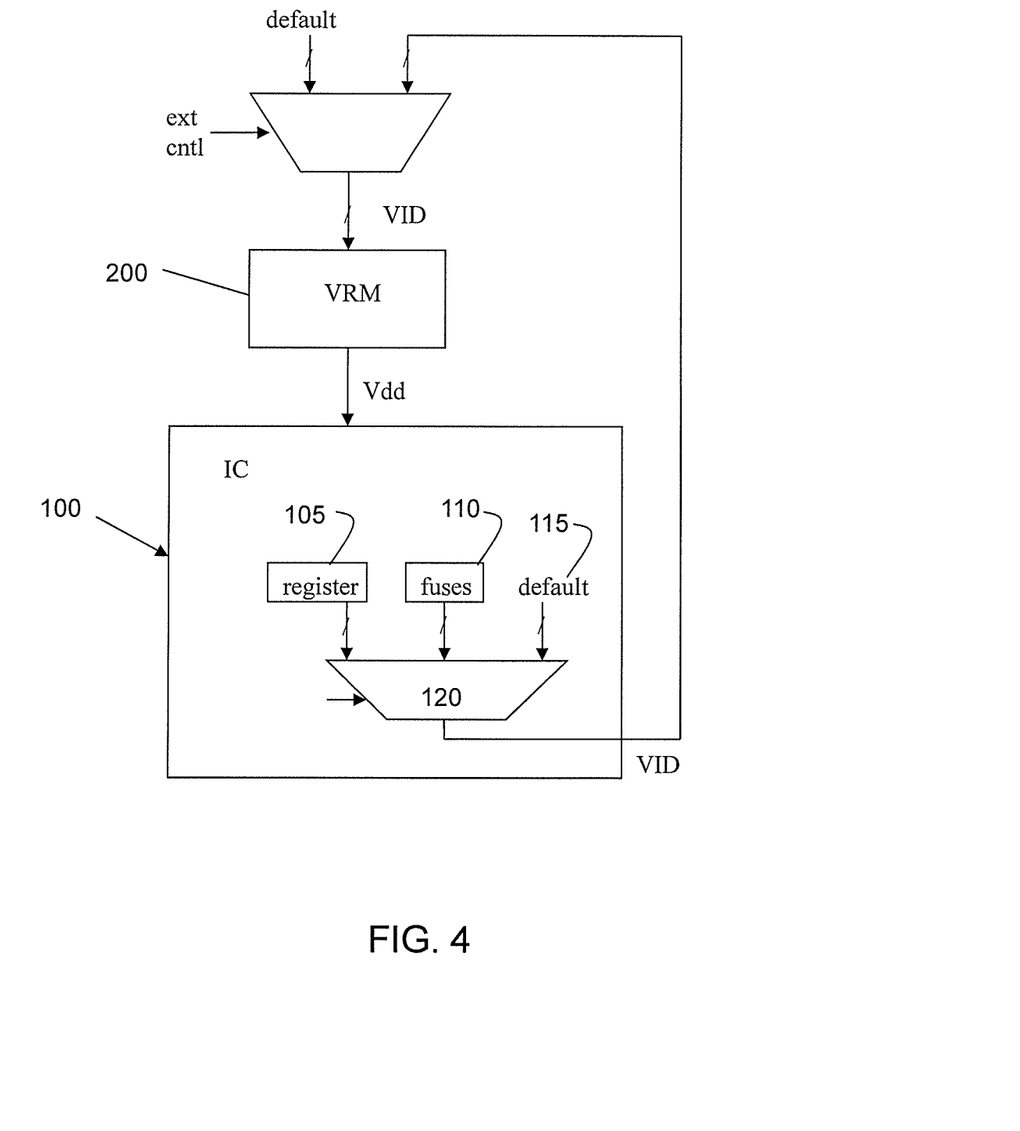
FIG. 4 shows a schematic of an exemplary system and integrated circuit (IC) implementing aspects of the present invention.

FIG. 4 shows a schematic of an exemplary system and integrated circuit (IC) implementing aspects of the present invention. More specifically, this schematic shows, for example, the IC 100 comprising the register 105, e-fuses 110 and default input 115. In embodiments, at the beginning of the power on sequence, the external control signal is asserted to select the system specified default value as the VID input to the VRM 200. This causes the VRM 200 to apply the default Vdd value to the IC 100. In embodiments, the VRM 200 provides the IC 100 the appropriate supply voltage, e.g., converting +5 V or +12 V to a lower voltage required by the IC 100. After the IC has power, it applies that same default value to its VID output, which is then selected as the VID input to the VRM by negating the external control signal. Once the fuses have been read, the fuse value is selected by an internal multiplexor 120 instead of the default value, and so the VID output drives the VRM to the chip specific value for Vdd.

By using the exemplary system and integrated circuit (IC) shown in FIG. 4 (and FIG. 1), it is possible to determine a combination of fuses that need to be set in order to provide a module specific voltage for an integrated circuit (IC) under test, and set the combination of fuses to provide the module specific voltage. In this way, that IC can run in a system within predetermined performance parameters including frequency and power consumption.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium and/or device. A computer readable storage medium and/or device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium and/or device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium and/or device may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 5:
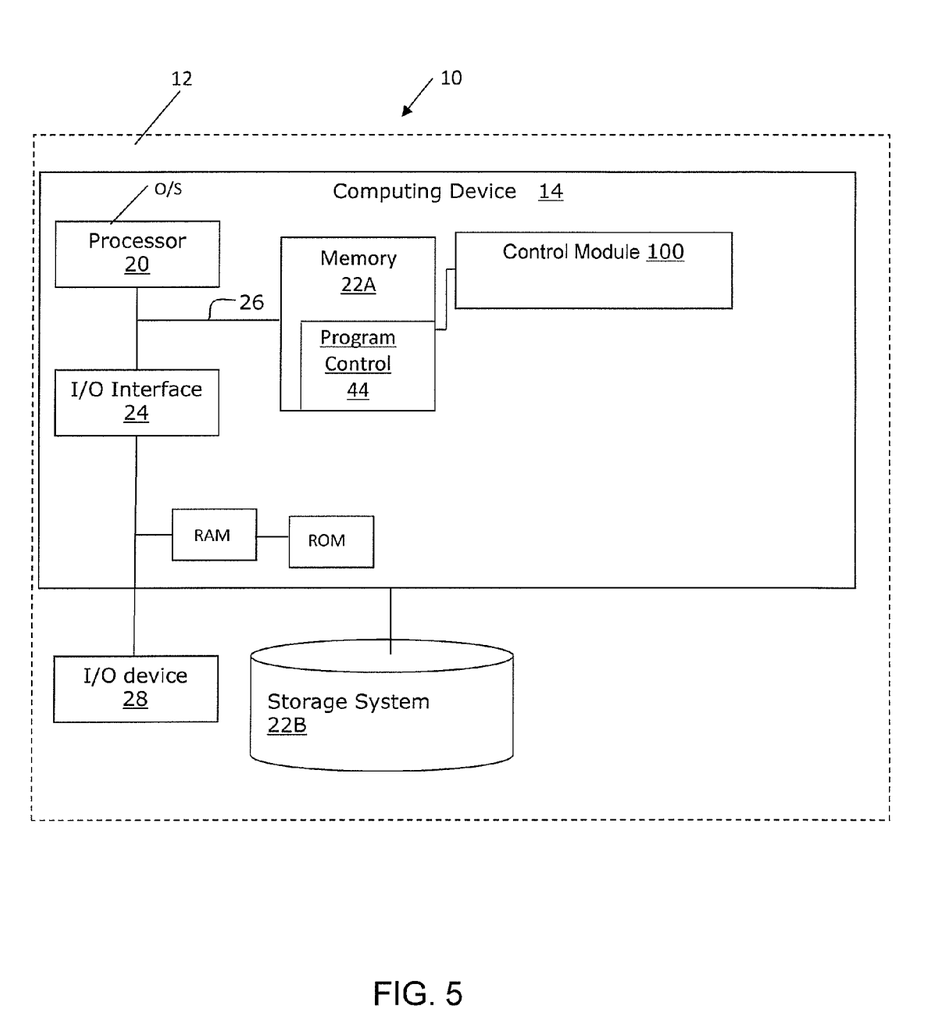
FIG. 5 is a system environment for implementing processes in accordance with aspects of the present invention.

FIG. 5 shows an illustrative environment 10 for managing the processes in accordance with the invention. To this extent, environment 10 includes a server or other computing system 12 that can perform the processes described herein. In particular, server 12 includes a computing device 14. The computing device 14 can be resident on a network infrastructure or computing device of a third party service provider (any of which is generally represented in FIG. 5).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14 (e.g., user interface) or any device that enables computing device 14 to communicate with one or more other computing devices using any type of communications link. The external I/O device/resource 28 may be for example, a handheld device, PDA, handset, keyboard etc.

In general, processor 20 executes computer program code (e.g., program control 44), which can be stored in memory 22A and/or storage system 22B. Moreover, in accordance with aspects of the invention, program control 44 controls a control module 100, e.g., the processes described herein. The control module 100 can be implemented as one or more program code in program control 44 stored in memory 22A as separate or combined modules. Additionally, control module 100 may be implemented as separate dedicated processors or a single or several processors to provide the function of these tools. While executing the computer program code, the processor 20 can read and/or write data to/from memory 22A, storage system 22B, and/or I/O interface 24. The program code executes the processes of the invention. The bus 26 provides a communications link between each of the components in computing device 14.

In embodiments, after the steps described above, e.g., setting the fused voltage, control module 100 can control the voltage or frequency of the IC during run time. For example, control module 100 can read the voltage values as programmed into the IC and, by controlling registers of the IC, if the system is operating in a reduced function mode, control module 100 can program a lower voltage to be output on the voltage selection pins of the IC to reduce power during idle times, for example. In embodiments, control module 100 can then reprogram the higher voltage value before returning to full function mode. In embodiments, control module 100 can also be used to control the frequency, e.g., raise or lower, of the IC. For example, control module 100 can run the IC at ½ frequency and, hence also lower the voltage to save power. In this way, control module 100 can run the IC (module) below a power envelope to reduce power. This, in turn, can also reduce performance, even though the IC is running at the same frequency after adjustment.

The computing device 14 can comprise any general purpose computing article of manufacture capable of executing computer program code installed thereon (e.g., a personal computer, server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, computing infrastructure 12 is only illustrative of various types of computer infrastructures for implementing the invention. For example, in embodiments, server 12 comprises two or more computing devices (e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 6:
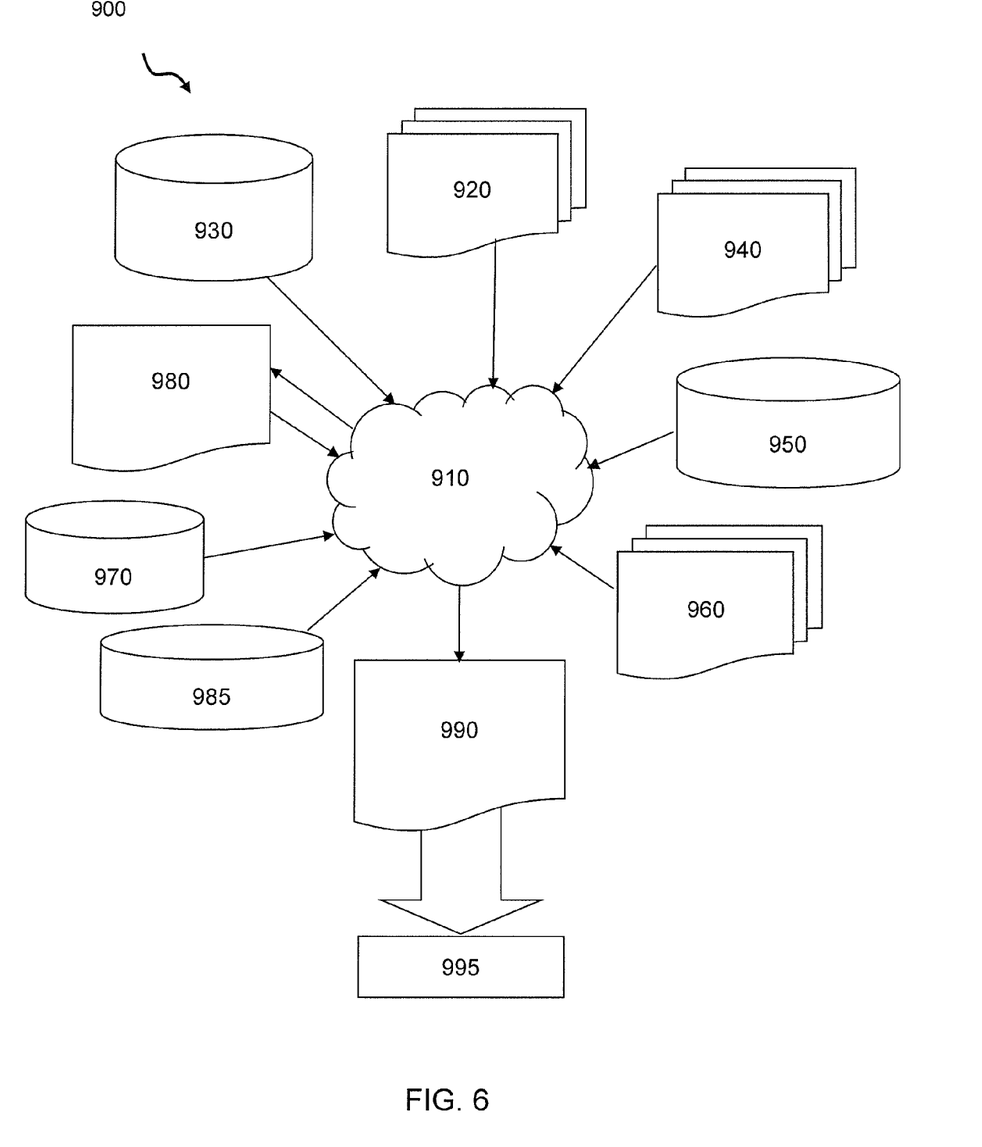
FIG. 6 is a flow diagram of a design process used in semiconductor design, manufacture, and/or test.

FIG. 6 is a flow diagram of a design process used in semiconductor design, manufacture, and/or test. FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Thus, the design structures can be provided in a computer program product comprising a computer readable storage medium having stored/encoded thereon. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention. In one embodiment, design structure 990 may comprise a compiled, executable HDL simulation model that functionally simulates the devices.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    determining characteristics of an integrated circuit (IC);
    determining a module specific voltage of the IC to meet a designed target frequency and power characteristics, based on the determined IC characteristics;
    setting the module specific voltage by using a combination of fuses within the IC;
    setting a clock frequency which is lower than an operating frequency of the IC;
    applying a default voltage driven from an external control;
    driving the default voltage at output pins of the IC;
    increasing the clock frequency to a nominal operating frequency of the IC;
    discontinuing the external control so that the default voltage specified by the IC now controls a voltage regulator module (VRM);
    reading the fuses to determine the appropriate voltage adjustment for driving the IC under certain power and specification conditions; and
    adjusting the IC to the module specific voltage corresponding to the fuse values used to drive the output pins.

2. The method of claim 1, wherein the characteristics of the IC are determined by measuring a current that the IC draws and a speed of a test oscillator, on the IC, when running at a fixed voltage.

3. The method of claim 2, wherein the module specific voltage is selected based on the characteristics of the IC.

4. The method of claim 3, further comprising verification that the module specific voltage is correct by running additional tests at the module specific voltage, prior to blowing a corresponding VID value into the fuses.

5. The method of claim 4, wherein the setting comprises determining which fuses in the IC to blow in order to set the module specific voltage for the designed target frequency and power characteristics.

6. The method of claim 4, wherein the setting comprises a certain combination of the fuses to drive a fused voltage value Vdd at VID pins.

7. The method of claim 6, wherein the setting comprises having the fused voltage value Vdd lower than an initial Vdd for the IC, which runs faster than specified performance parameters.

8. The method of claim 6, wherein the setting comprises having the fused voltage value Vdd higher than an initial Vdd for the IC, which runs slower than specified performance parameters.

9. The method of claim 1, wherein powering-up the IC within a system environment comprises in a sequence:
    the setting the clock frequency which is lower than an operating frequency of the IC;
    the applying the default voltage driven from an external control;
    the driving the default voltage at output pins of the IC;
    the increasing the clock frequency to the nominal operating frequency of the IC;
    the discontinuing the external control so that the default voltage specified by the IC now controls a voltage regulator module (VRM);
    the reading the fuses to determine the appropriate voltage adjustment for driving the IC under certain power and specification conditions; and
    the adjusting the IC to the module specific voltage corresponding to the fuse values used to drive the output pins.

10. A method, comprising:
    driving a voltage that guarantees the integrated circuit (IC) will work within system power/thermal design parameters of a system, during power up time;
    reading an IC specific operating voltage from set fuses of the IC;
    adjusting the IC to the IC specific operating voltage by driving output pins with fused voltage values, which allows the IC to stay within power/thermal budget for all design functions; and further comprising, in sequence:

setting a clock frequency which is lower than an operating frequency of the IC;

applying a default voltage driven from an external control;

driving the default voltage at the output pins of the IC;

increasing the clock frequency to a nominal operating frequency of the IC;

discontinuing the external control so that the default voltage specified by the IC now controls a voltage regulator module (VRM);

reading the fuses to determine the IC specific operating voltage for driving the IC within the system power/thermal design parameters; and adjusting the IC to the IC specific operating voltage corresponding to the fused voltage values used to drive the output pins.

11. The method of claim 10, wherein the reading comprises reading a combination of fuses to determine a specific voltage for operating the IC under specified performance parameters.

12. The method of claim 10, wherein during power up, an external power voltage regulator module is forced to supply the default voltage in which the IC on that power supply is guaranteed to operate.

13. The method of claim 12, wherein the external source is removed and the default voltage is controlled by VID values of the IC at its output pins.

14. The method of claim 13, wherein the default voltage is dependent on system design and technology.

15. The method of claim 10, wherein the adjusting comprises setting a certain combination of VID fuses to drive a fused voltage value Vdd at VID pins of the IC.

16. The method of claim 15, wherein the fused voltage value Vdd comprises lowering the Vdd for the IC running faster than the specified performance parameters.

17. The method of claim 15, wherein the fused voltage value Vdd comprises raising the Vdd for the IC running slower than the specified performance parameters.

18. The method of claim 10, further comprising further adjusting a voltage of the IC by software implementation.

19. A method, comprising:

determining a combination of fuses that need to be set in order to provide a module specific voltage for an integrated circuit (IC) under test; and setting the combination of fuses to provide the module specific voltage in order for the IC under test to run within predetermined performance parameters including frequency and power consumption within a system environment, and further comprising:

setting a clock frequency which is lower than an operating frequency of the IC;

applying a default voltage driven from an external control;

driving the default voltage at output pins of the IC;

increasing the clock frequency to a nominal operating frequency of the IC;

discontinuing the external control; and reading the fuses to determine the appropriate voltage adjustment for driving the IC under certain power and specification conditions.

* * * * *